United States Patent [19]

Takahashi

[11] Patent Number: 4,553,052

[45] Date of Patent: Nov. 12, 1985

[54] HIGH SPEED COMPARATOR CIRCUIT WITH INPUT-OFFSET COMPENSATION FUNCTION

[75] Inventor: Kazukiyo Takahashi, Tokyo, Japan

[73] Assignee: NEC Corporation, Tokyo, Japan

[21] Appl. No.: 488,224

[22] Filed: Apr. 25, 1983

[30] Foreign Application Priority Data

Apr. 23, 1982 [JP] Japan .................................. 57-68456
Apr. 23, 1982 [JP] Japan .................................. 57-68460

[51] Int. Cl.[4] .......................... H03K 5/24; H03K 17/16
[52] U.S. Cl. ........................................ 307/494; 307/269; 307/291; 307/352; 307/355; 307/358; 307/491; 328/147
[58] Field of Search ...................... 307/200 B, 491, 494, 307/497, 501, 358, 352–356, 246, 279, 291, 269; 328/116–117, 146–147, 149

[56] References Cited

U.S. PATENT DOCUMENTS

| | | | |
|---|---|---|---|
| 4,044,343 | 8/1977 | Uchida | 307/279 X |
| 4,045,686 | 8/1977 | Masuda | 328/146 X |
| 4,048,524 | 9/1977 | Laugesen et al. | 307/279 X |
| 4,121,120 | 10/1978 | Wetterling | 307/352 |
| 4,328,434 | 5/1982 | Geller | 307/359 |
| 4,406,988 | 9/1983 | Scholz | 307/358 X |
| 4,450,368 | 5/1984 | Spence | 307/491 X |
| 4,463,272 | 7/1984 | Tucker | 307/358 |

FOREIGN PATENT DOCUMENTS

0150613 11/1980 Japan .................................. 307/494

*Primary Examiner*—Stanley D. Miller
*Assistant Examiner*—D. R. Hudspeth
*Attorney, Agent, or Firm*—Sughrue, Mion, Zinn, Macpeak, and Seas

[57] ABSTRACT

A comparator circuit which can operate at a high-speed and with a high comparison accuracy. The comparator circuit comprises a differential amplifier provided with an input offset voltage compensating circuit which stores the offset voltage and derives an offset-free output signal from the amplifier in response to first and second states of a first control signal and a latch circuit for storing the offset-free output signal in response to a second control signal having a higher frequency than the first control signal.

14 Claims, 8 Drawing Figures

HIGH SPEED COMPARATOR CIRCUIT WITH INPUT-OFFSET COMPENSATION FUNCTION

BACKGROUND OF THE INVENTION

1. Field of the Invention

The present invention relates to a comparator circuit for comparing two signals, and more particularly to a comparator circuit provided with an input offset voltage reducing circuit for compensating for the input offset voltage by making use of the voltage-storing function of capacitors.

2. Description of the Prior Art

In a comparator circuit of this kind, the accuracy of a signal comparison operation is substantially determined by the input offset voltage of an initial stage differential amplifier. For compensating the input offset voltage, it has been performed to charge a capacitor with the offset voltage during a standby period and to subtract the voltage stored in the capacitor from the output voltage of the differential amplifier to generate an offset-free output signal during the comparison period. The offset-free output signal i.e. the result of the comparison is latched by a latch circuit during the subsequent period. Usually, the latching operation of the comparison output signal and the operation of the differential amplifier are conducted alternately, and hence the latch circuit is in operation when the differential amplifier is on standby to latch the output signal which has been amplified in the previous period by the differential amplifier. In the conventional comparator circuit thus far described, the pulse period of a control signal controlling a switch circuit used when the capacitor is being charged with the offset voltage and the pulse period of a control signal controlling the latch circuit are equal but have opposite phases. As a result, the sampling period is determined by the period making the offset voltage compensating circuit set, thus making it difficult to realize a fast operation. If the time period for charging the capacitor with the offset voltage is lengthened, more specifically, the charging operation can be completely achieved to increase the accuracy, however, the sampling period is accordingly extended and its high-speed operation is resultantly lost. However, if the sampling period is shortened to aim at a higher speed, on the other hand, the time period available for charging the capacitor with the offset voltage must be shortened to produce the defect that the accuracy is reduced. This makes it impossible to provide a comparator circuit which operates both at a high speed and with a high accuracy.

SUMMARY OF THE INVENTION

It is an object of the present invention to provide a comparator circuit which can operate both at a high speed and with a high accuracy.

In the present invention, a control signal having a shorter period than that of a control signal controlling an offset voltage compensating circuit is used for a latch circuit, and the standby period of a differential amplifier is made sufficiently longer than the period of the control signal for the latch circuit. In the present invention, the latch circuit can be operated several times within the time period during which the input offset of the offset voltage compensating circuit is effectively held in the capacitor, so that high-speed comparisons can be realized that are substantially in proportion to the operating period of that latch circuit.

According to one aspect of the present invention, there is provided a high-speed comparator comprising: a differential amplifier provided with an input offset voltage compensating circuit using a DC restorer of the capacitor-coupling type for compensating an input offset voltage; a latch circuit receiving the output of the differential amplifier; a first generator generating a first control signal controlling the differential amplifier in such a manner that an operating period thereof is at least twice as long as a standby period thereof; a second generator generating a second control signal, which has a shorter cycle period than that of the first control signal, controlling the latch circuit; and a status signal generator informing a peripheral of whether the differential amplifier is on standby or is operating.

According to another aspect of the present invention, there is provided a high-speed comparator circuit comprising two sets of a differential amplifier provided with an input offset voltage compensating circuit for reducing the input offset voltage by making use of the voltage-storing function of capacitors and a latch circuit, in which the two differential amplifiers having the input offset voltage compensating circuits can be operated alternately for sufficiently long periods of time, and by operating the two latch circuits at a high speed in response to the same clock signals, the significant comparison outputs, which are generated alternately by the two latch circuits, are multiplexed so as to apparently eliminate the standby time period so that a series of significant comparison output signals can be generated at a high speed.

According to still another aspect of the present invention, there is also provided a high-speed comparator circuit comprising: a first differential amplifier including an input offset voltage compensating circuit making use of a DC restorer of the capacitor-coupling type and operating in response to a first clock signal; a first latch circuit receiving the output of the first differential amplifier and operating in response to a second clock signal of a higher frequency than the first clock signal; a second differential amplifier including an input offset voltage compensating circuit making use of a DC restorer of the capacitor-coupling type and operating in response to a third clock signal which is in a logically complementary relationship with the first clock signal; a second latch circuit receiving the output of the second differential amplifier and operating in response to the second clock signal; and a multiplexer receiving the outputs of the first latch circuit and the second latch circuit to switch one of them in response to the first clock signal in a switching manner.

DESCRIPTION OF THE PREFERRED EMBODIMENTS

Figure 1:
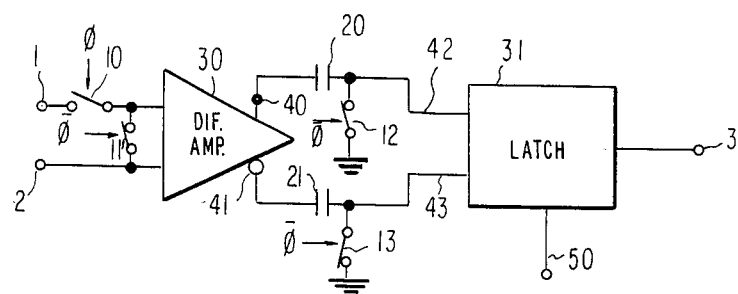
FIG. 1 is a diagram of a comparator circuit according to the prior art.

A prior art comparator circuit is shown in FIG. 1. A signal voltage is applied to an input terminal 1 and a reference voltage is applied to an input terminal 2. A switch 10 is so controlled by a clock signal $\phi$ shown in FIG. 2(a) that it is turned on during a time period I and off during a time period II. Switches 11, 12 and 13 are controlled by a clock signal $\bar{\phi}$ shown in FIG. 2(b). The states of the switches in FIG. 1 are those for the time period II. In this period II, the input terminals of a differential amplifier 30 are short-circuited by the switch 11 and commonly supplied with the reference voltage. At the same time, under this state, the offset voltage of the differential amplifier 30 appears as a voltage difference between output terminals 40 and 41. The switches 12 and 13 are on so that the capacitors 20 and 21 are charged with the voltages at the output terminals 40 and 41, respectively. Data concerning the offset voltage is stored as a voltage difference between the capacitors 20 and 21.

Figure 2:
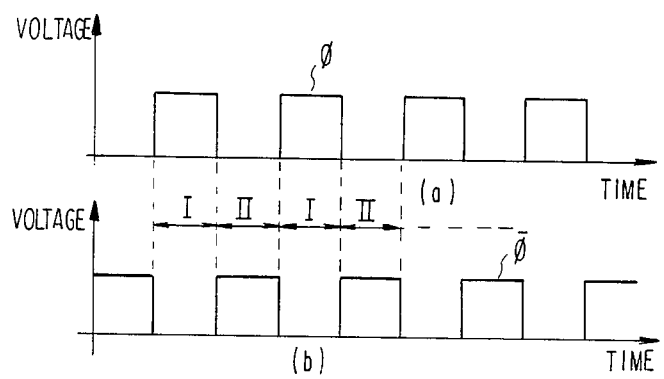
FIG. 2 is a timing chart of the waveforms of the signals used in the circuit of FIG. 1.

A latch circuit 31 is in standby state during the period I, because the control signal $\bar{\phi}$ of FIG. 2(b) is applied to a terminal 50 for controlling its write operation, and latches the offset voltage compensated voltage appearing at terminals 42 and 43 during the period II, and generates a comparison result at its output terminal 3.

In the conventional circuit thus far described, the speed and accuracy are determined by the speed at which the capacitors 20 and 21 are charged. If the charging time is sufficiently extended, generally speaking, data relating to the offset voltage can be stored to a sufficiently high accuracy, but the defect arises that the operation speed is reduced. On the other hand, the speed would be increased, but the defect arises that the comparison accuracy is reduced. Thus, the two features of high speed and high accuracy cannot be satisfied simultaneously.

Figure 3:
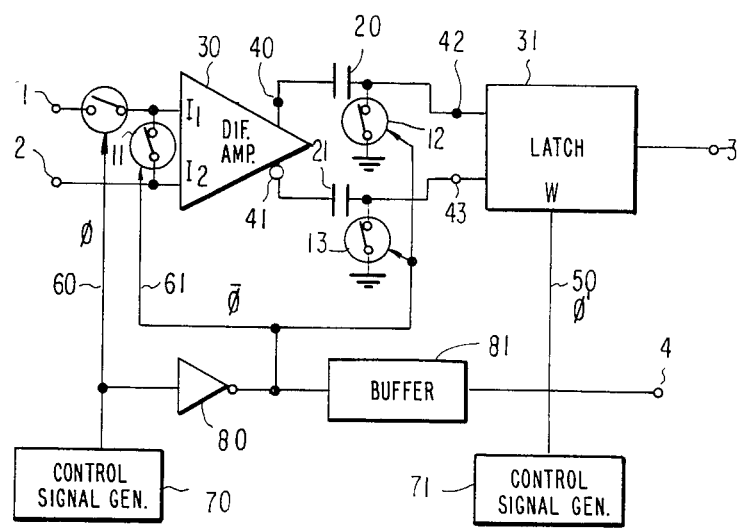
FIG. 3 is a block diagram of one embodiment of the present invention.
Figure 4:
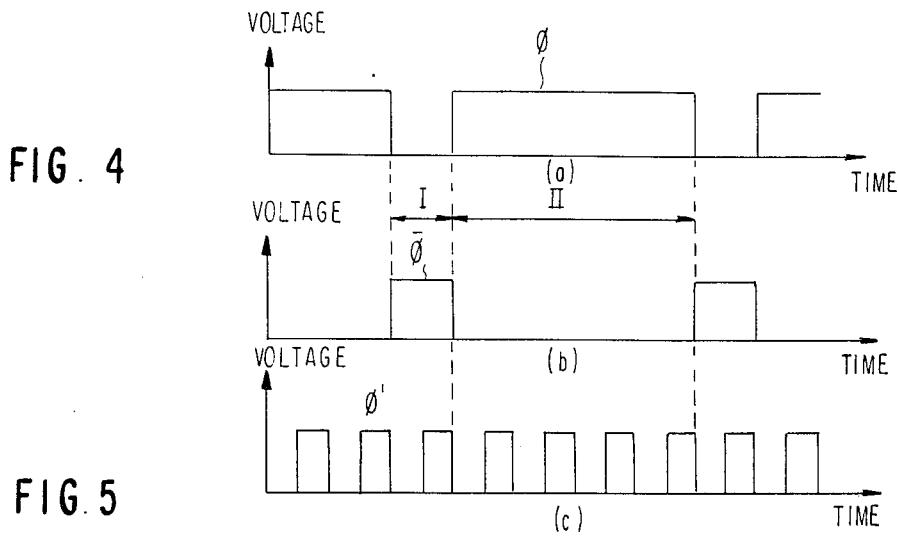
FIG. 4 is a timing chart of the waveforms of the signals used in the circuit of FIG. 3.

With reference to FIGS. 3 and 4, one embodiment of the present invention will be described in the following.

The differential amplifier 30 has one input $I_1$ connected by the switch 10 to the input terminal 1 and another input $I_2$ connected directly to the input terminal 2. The short-circuiting switch 11 is connected between the terminals $I_1$ and $I_2$. The switch 10 has a control terminal thereof supplied with the signal $\phi$ from a control signal generator 70 through a line 60, and the switch 11 has a control terminal thereof supplied, through a line 61, with the signal $\bar{\phi}$ which is obtained by introducing the signal $\phi$ into an inverter 80.

The true output terminal 40 of the differential amplifier 30 is connected to one terminal of the capacitor 20, the other terminal of which is grounded through the switch 12 and connected to the input terminal 42 of the latch circuit 31. The complementary output terminal 41 of the differential amplifier 30 is connected to one terminal of the capacitor 21. The other terminal of the capacitor 21 is grounded through the switch 13 and connected to the input terminal 43 of the latch circuit 31. The switches 12 and 13 have control terminals supplied with the control signal $\bar{\phi}$. This control signal $\bar{\phi}$ from the inverter 80 is supplied as a standby instruction signal to a terminal 4 through a buffer 81. The latch 31 has a write control terminal W thereof supplied with a control signal $\phi'$ from a control signal generator 71, which has a higher frequency than that of the control signal $\phi$.

With reference to FIG. 4, the operation of the comparator circuit according to the present invention will be described in the following. During the period I in which the signal $\phi$ is at low level, the switch 10 is open (off). During the period II in which the signal $\phi$ is at high level, on the other hand, the switch 10 is closed (on). While the switches 11, 12 and 13 are supplied with the control signal $\bar{\phi}$ so that they are closed (on) during the period I and open (off) during the period II. As can be understood from these relationships, the offset voltage of the differential amplifier 30 is stored in the capacitors 20 and 21 during the period I, and the input signal is amplified in an analog manner during the period II. The duration of the period I is set by taking the charging rate into consideration so that the desired accuracy can be achieved. The period II can be extended within a range that allows the data relating to the offset voltage stored in the capacitors 20 and 21 to maintain the desired accuracy. Usually when such a circuit is integrated, the data is carried and lost by leakage currents through the p-n junction attendant on the input terminals 42 and 43 of the latch circuit 31. This loss is usually extremely small so that the period II can be made much longer than the period I. In order to provide a better performance than that of the circuit of the prior art, however, the period II must be at least twice as long as the period I. The signal which has been amplified in an analog manner during the period II is applied through the terminals 42 and 43 to the latch circuit 31, in which it is sampled and latched. The latch circuit 31 is supplied through the line 50 with the control signal $\phi'$, shown in FIG. 4(c), from the control signal generator 71. The latch circuit 31 itself can operate at a high speed so that it can sample several times during the period II. As illustrated in FIG. 4(c), four pulses for the latching operation are generated during the period II so that four sampling operations can be conducted. Generally speaking, the sampling can only be done the number of times set by the operating speed of the latch circuit used. An output is generated from the output terminal 3 of the latch circuit 31 during the period I, since this is meaningless, the peripheral circuits must be informed to inhibit the output during the period I. For this purpose, it may be sufficient to generate the signal of FIG. 4(b) as a standby instruction signal through the buffer 81 and output it from the terminal 4.

In the comparator circuit according to the present invention, as is apparent from the description thus far made, the control signal for the sampling latch is prepared and applied to the latch circuit independently of the control signal reducing the offset voltage, so that the sampling can be conducted at a high speed without reducing the desired accuracy. In other words, it is possible to provide a high-speed comparator.

Figure 5:
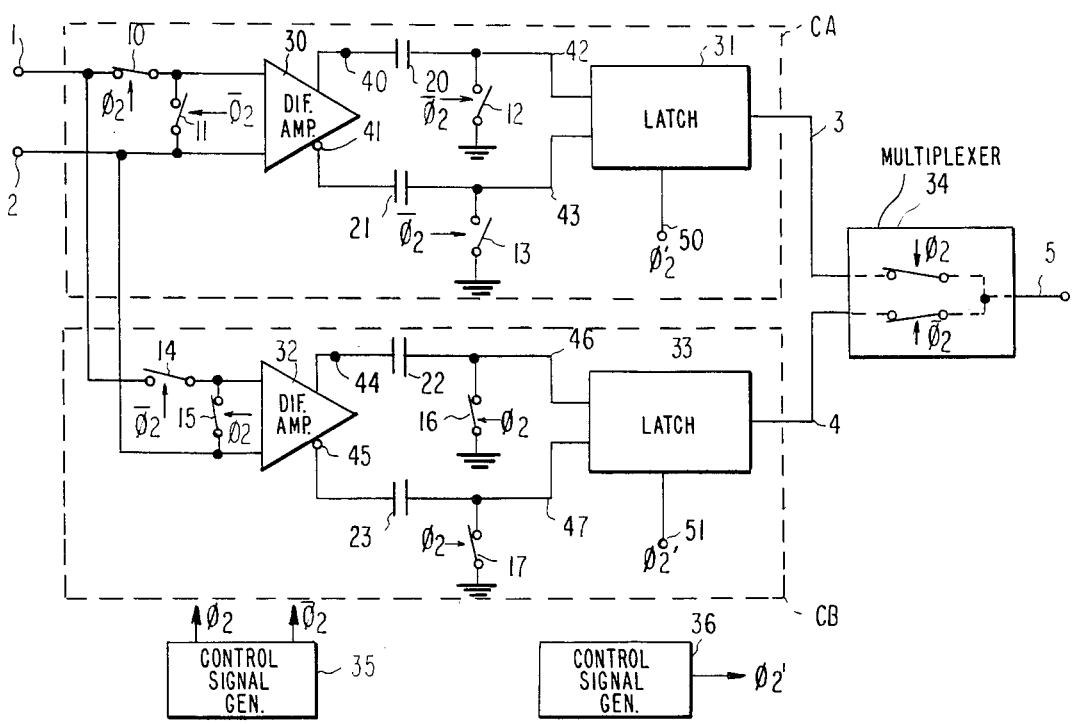
FIG. 5 is a block diagram of a second embodiment of the present invention.
Figure 6:
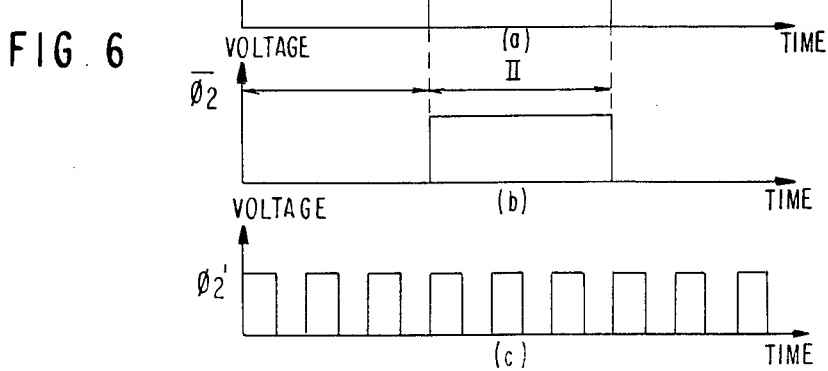
FIG. 6 is a timing chart of the waveforms of the signals used in the circuit of FIG. 5.

With reference to FIGS. 5 and 6, a second embodiment of the present invention will be described in the following.

In this embodiment, two comparator units CA and CB are made to operate alternately and the output of the unit in operation is extracted from an output terminal 5 through a multiplexer 34.

Specifically, the switch 10 of the unit CA is supplied with a control signal $\phi_2$, which is generated by a control signal generator 35, and its switches 12 and 13 have control terminals supplied with a control signal $\bar{\phi_2}$, which has the opposite phase to the signal $\phi_2$ and which compensates for the input offset voltage in response to the control signal $\overline{\phi_2}$, to conduct comparisons in response to the control signal $\phi_2$, and to latch the result of the comparison in the latch circuit 31, which has its writing operation controlled by a control signal $\phi_2'$ from a control signal generator 36, the signal $\phi_2'$ having a higher frequency than that of the control signal $\phi_2$. In the unit CB, switches 16 and 17 are turned on in response to the control signal $\phi_2$ to effect the input offset compensation and compare the signals input thereto in response to the control signal $\overline{\phi_2}$. The multiplexer 34 connects the output terminal 3 of the latch circuit 31 to a terminal 5 in response to the signal $\phi_2$, and a terminal 4 of a latch circuit 33 to terminal 5 in response to the signal $\overline{\phi_2}$.

As shown in FIG. 5, switches 10, 15, 16 and 17 are on and switches 11, 12, 13 and 14 are off so that the signal input from terminal 1 and the comparison voltage from terminal 2 are differentially amplified by the action of the differential amplifier 30 and are transmitted through the capacitors 20 and 21 to the input terminals 42 and 43 of the latch circuit 31. The capacitors 20 and 21 are charged with the offset voltages of the differential amplifiers 30 and 32, and the voltages are transmitted to the input terminals 42 and 43 in such a way that the offset voltage of the differential amplifier 30 is excluded therefrom. At the same time, the input terminals of the differential amplifier 32 are short-circuited by the switch 15, and the input signal is blocked by the switch 14. The switches 16 and 17 are turned on so that the offset voltage of the differential amplifier 32 is stored in capacitors 22 and 23. At the same time, the input terminals 46 and 47 of a latch circuit 33 are grounded. The operations thus far described are conducted by the actions of the switches 10 to 17, which are controlled by control signals generated from output terminals 60 and 61 of a control signal generator 35. The switches 10, 15, 16 and 17 are controlled by the control signal from the output terminal 60, and the switches 11, 12, 13 and 14 are controlled by the control signal from the output terminal 61. The latch circuits 31 and 33 are controlled by a control output from an output terminal 52 of a control circuit 36 through control terminals 50 and 51. Both the output terminal 3 of the latch circuit 31 and the output terminal 4 of the latch circuit 33 are connected through the multiplexer 34 to the output terminal 5.

The switches of the circuit shown in FIG. 5 are in the state which is controlled by waveform during the period I of FIG. 6. During the period II, on the other hand, the state of each of the switches is reversed. The significant signal is generated from terminal 3 during the period I and from terminal 4 during the period II. As a result, the multiplexer 34 is controlled so as to connect terminals 3 and 5 during the period I and terminals 4 and 5 during the period II. By adjusting the durations of the periods I and II, the capacitors 20, 21, 22 and 23 can be controlled so as to be charged to the desired accuracy by the offset voltages of the differential amplifiers 30 and 32.

The latch circuits 31 and 32 are enabled by the control signal $\phi_2'$ of FIG. 6(c) so that independent rates can be determined for the periods I and II. Generally speaking, a latch circuit can operate at a high speed. It is therefore understood that a circuit according to the present invention can conduct such a high-speed sampling operation with a sufficiently high accuracy to make sufficient use of the high speed of the latch circuit, which has not been utilized in the prior art.

Figure 7:
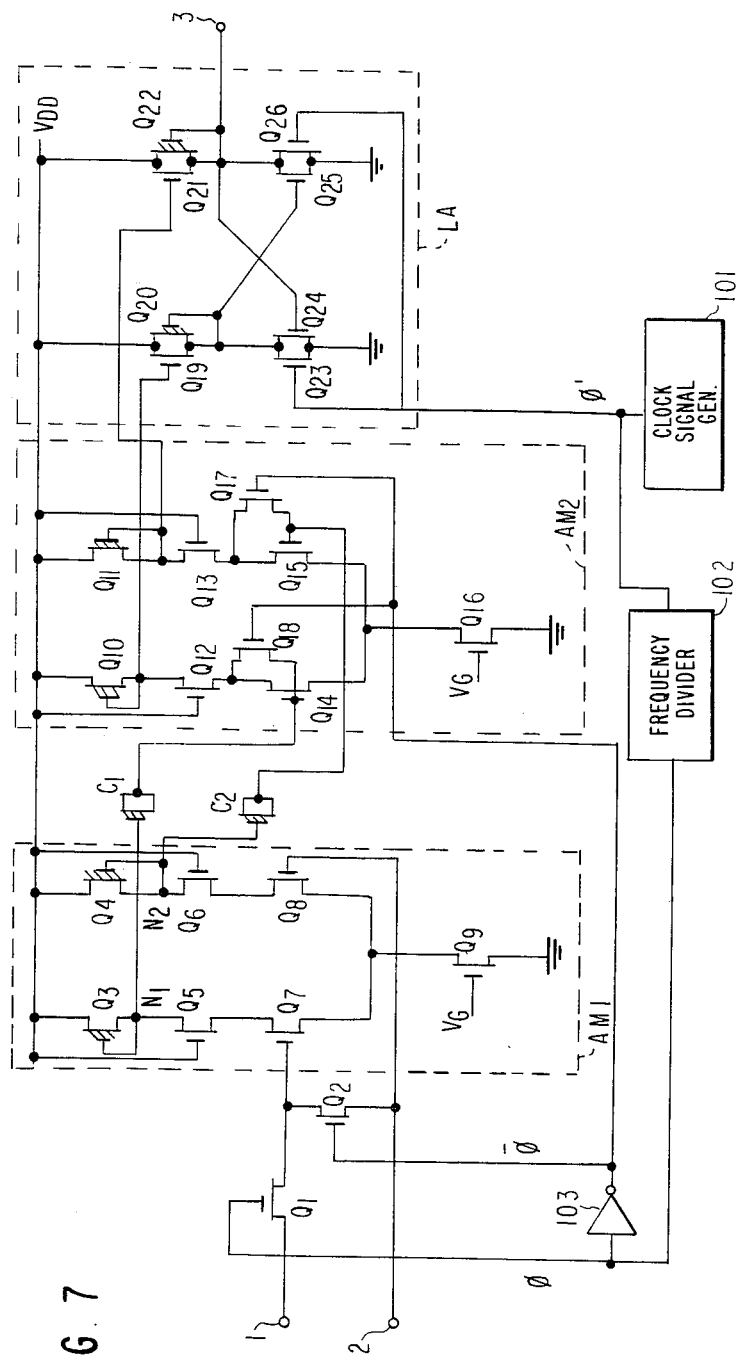
FIG. 7 is a circuit diagram of a third embodiment of the present invention.

Next, with reference to FIGS. 7 and 8, a third embodiment of the present invention will be described in the following.

In this embodiment, a differential amplifier AM2 for intermediate amplification is inserted between a differential amplifier AM1 corresponding to the differential amplifier 30 of FIG. 3, and a latch circuit 1A, and accordingly, the input offset voltage associated with both the amplifiers AM1 and AM2 are compensated as a whole. A clock signal generator 101 generates a clock signal $\phi'$ for controlling a latch circuit LA. A frequency divider 102 receives the clock signal $\phi'$ and generates a clock signal $\phi$ whose frequency is far lower than that of the signal $\phi'$. An inverter 103 generates a clock signal $\overline{\phi}$ having the opposite phase with respect to the signal $\phi$.

The differential amplifier AM1 is constructed of: depletion FETs (D-FETs) $Q_3$ and $Q_4$; enhancement-mode FETs (E-FETs) $Q_5$ and $Q_6$ having gates connected to a power source $V_{DD}$; an E-FET $Q_7$ whose gate is connected through an E-FET $Q_1$ to the input terminal 1; an E-FET $Q_8$ whose gate is connected to the input terminal 2; and an E-FET $Q_9$ operating as a constant current source. A pair of outputs are extracted from an intermediate node $N_1$ between the D-FET $Q_3$ and the E-FET $Q_5$ and an intermediate node $N_2$ between the D-FET $Q_4$ and the E-FET $Q_6$. These outputs are connected to one terminal each of capacitors $C_1$ and $C_2$, respectively. The capacitors $C_1$ and $C_2$ are constructed of D-FETs, the gates of which provide the above terminals and the sources, and drains of which together provide the other terminals of the capacitors.

The intermediate amplifier AM2 is constructed of D-FETs $Q_{10}$ and $Q_{11}$ and E-FETs $Q_{12}$ to $Q_{17}$ in the same way as in the amplifier AM1.

Both an E-FET $Q_{18}$ connected between the gate and drain of the E-FET $Q_{14}$ and the E-FET $Q_{17}$ connected between the drain and gate of the E-FET $Q_{15}$ are turned on together with an E-FET $Q_2$ by the control signal $\phi$ so as to charge the capacitors $C_1$ and $C_2$ with the input offset voltages relating to the amplifiers AM1 and AM2.

Namely, as well as short-circuiting between the gates of E-FETs $Q_7$ and $Q_8$ as the input terminals as the amplifier AM1, the other terminals of the capacitors $C_1$ and $C_2$ are connected to nodes $N_5$ and $N_6$ by conducting E-FETs $Q_{18}$ and $Q_{17}$, in addition to the connections to the gates of E-FETs $Q_{14}$ and $Q_{15}$, respectively in response to the clock $\phi$. Here, the nodes $N_5$ and $N_6$ are intermediate junctions between input transistors ($Q_{14}$, $Q_{15}$) and load circuits ($Q_{10}$ and $Q_{12}$; $Q_{11}$ and $Q_{13}$) at which amplified signals appear.

According to this feature, the input offset voltage belonging to both the amplifiers AM1 and AM2 are simultaneously compensated.

The latch circuit LA is constructed so that both the parallel circuit of an E-FET $Q_{19}$ whose gate is connected to an output node $N_3$ of the amplifier AM2 and a D-FET $Q_{20}$, and the parallel circuit of an E-FET $Q_{21}$ whose gate is connected to an output node $N_4$ of the amplifier AM2 and a D-FET $Q_{22}$, are used as loads, while E-FETs $Q_{24}$ and $Q_{25}$ are cross-connected through connection nodes $N_5$ and $N_6$, and writing control E-FETs $Q_{23}$ and $Q_{26}$ are connected to ground between the connection nodes $N_5$ and $N_6$, respectively. The writing control E-MOSTs $Q_{25}$ and $Q_{26}$ are turned on in response to the clock $\phi'$ to take in new data which is latched by the E-FETs $Q_{24}$ and $Q_{25}$ when the E-MOSTs $Q_{23}$ and $Q_{26}$ are off.

Figure 8:
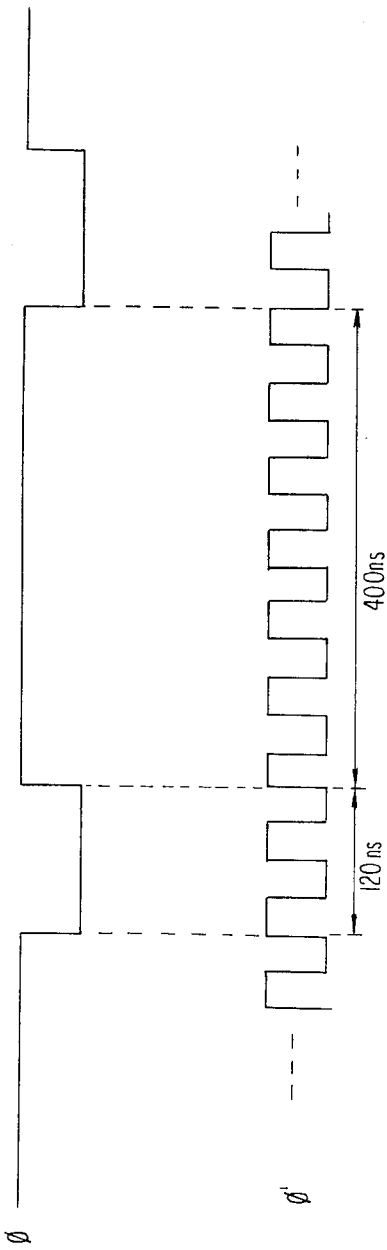
FIG. 8 is a timing chart of the waveforms of the signals used in the circuit of FIG. 7.

FIG. 8 illustrates specific examples of the signals $\phi$ and $\phi'$.

The signal $\phi$ can have a high level of 400 ns and a low level of 120 ns whereas the signal $\phi'$ can have a frequency of 50 to 100 MHz.

Thus, according to the present invention, it is possible to provide a comparator circuit which has an extremely high accuracy and speed.

I claim:

1. A comparator circuit comprising first and second signal terminals, a differential amplifier having first and second input terminals and first and second output terminals, a first switch coupled between said first signal terminal and said first input terminal of said differential amplifier, a second switch coupled between said first and second input terminals of said differential amplifier, first and second nodes, a first capacitor coupled between said first output terminal of said differential amplifier and said first node, a second capacitor coupled between said second output terminal of said differential amplifier and said second node, a third switch coupled between said first node and a reference potential, a fourth switch coupled between said second node and said reference potential, a latch circuit having first and second input terminals, a write control terminal and an output terminal, means for connecting said first node to said first input terminal of said latch circuit, means for connecting said second node to said second input terminal of said latch circuit, means for supplying control terminals of said second to fourth switches with a first clock signal, means for supplying a control terminal of said first switch with a second clock signal having the opposite phase to said first clock signal, and means for supplying said write control terminal of said latch circuit with a third clock signal having a higher frequency than said first clock signal, in which a comparison result of signals at said first and second signal terminals are derived a plurality of times from said output terminal of said latch circuit in response to said third clock signal during the same period that said second clock signal takes an active level for said first switch.

2. The circuit according to claim 1, in which each of said first to fourth switches includes a field effect transistor.

3. The circuit according to claim 1, in which each of said first and second capacitors includes a field effect transistor whose source and drain are electrically connected in common to form a first electrode of each capacitor with a gate of said field effect transistor as a second electrode of each capacitor.

4. A comparator circuit comprising a pair of signal terminals, a differential amplifier having a pair of input terminals receiving a pair of signals to be compared, means for coupling said pair of signal terminals to said pair of input terminals of said differential amplifier, a signal generating means for generating a first control signal having a first state and a second state and a second control signal having a first state and a second state, an offset compensating circuit coupled to said differential amplifier for storing an input offset voltage of said differential amplifier in response to the first state of said first control signal and compensating said input offset voltage to derive an offset-free signal from said differential amplifier in response to the second state of said first control signal, a latch circuit for operatively storing said offset-free signal in response to a plurality of the first states of said second control signal during the period when said first control signal takes said second state, and means for deriving a comparison output signal from said latch circuit.

5. The circuit according to claim 4, in which said offset compensating circuit includes a pair of capacitors.

6. The circuit according to claim 4, further comprising a frequency divider circuit for generating said first control signal by dividing the frequency of said second control signal.

7. A circuit comprising a pair of signal terminals for receiving a pair of input signals to be differentially amplified, a first differential amplifier having first and second input terminals and first and second output terminals, input switch means for operatively connecting said first and second input terminals of said first differential amplifier to said pair of signal terminals, a second differential amplifier having third and fourth input terminals and third and fourth output terminals, first and second capacitors, means for connecting said first capacitor between said first output terminal of said first differential amplifier and said third input terminal of said second differential amplifier, means for connecting said second capacitor between said second output terminal of said first differential amplifier and said fourth input terminal of said second differential amplifier, a first switch directly coupled between said first and second input terminals of said first differential amplifier, said first switch operatively short circuiting between said first and second input terminals, a second switch for operatively producing an electrical path between said third output terminal and said third input terminal, a third switch for operatively producing an electrical path between said fourth output terminal and said fourth input terminal, and means for simultaneously enabling said first to third switches for a first period, and means for enabling said input switch means for a subsequent second period, said second period being longer than said first period.

8. The circuit according to claim 7, in which each of said first and second amplifiers includes a pair of series circuits composed of a depletion-mode field effect transistor and an enhancement-mode field effect transistor as load circuits.

9. The circuit according to claim 7, in which each of said first to third switches includes an enhancement-mode field effect transistor.

10. The circuit according to claim 7, further comprising a latch circuit coupled to said third and fourth output terminals for operatively storing the output of said differential amplifier, means for enabling said latch circuit a plurality of times during said second period, and means for deriving a comparison output signal from said latch circuit.

11. A circuit comprising a pair of signal terminals for receiving a pair of input signals to be differentially amplified, a first differential amplifier having first and second input terminals and first and second output terminals, means for connecting said first and second input terminals of said first differential amplifier to said pair of signal terminals, a second differential amplifier having third and fourth input terminals and third and fourth output terminals, first and second capacitors, means for connecting said first capacitor between said first output terminal of said first differential amplifier and said third input terminal of said second differential amplifier, means for connecting said second capacitor between said second output terminal of said first differential amplifier and said fourth input terminal of said second differential amplifier, a first switch coupled between said first and second input terminals of said first differential amplifier, a second switch for operatively producing an electrical path between said third output terminal and said third input terminal, a third switch for operatively producing an electrical path between said fourth output terminal and said fourth input terminal, means for simultaneously controlling said first to third switches, a latch circuit coupled to said third and fourth output terminals, and means for repeatedly enabling said latch circuit at a higher frequency rate than the frequency rate of said first to third switches.

12. A comparator circuit comprising a pair of signal terminals, first and second differential amplifiers each having a pair of input terminals, first switching means for operatively coupling said pair of input terminals of said first differential amplifier to said pair of signal terminals, second switching means for operatively coupling said pair of input terminals of said second differential amplifier to said pair of signal terminals, control means for alternately enabling said first and second switching means, a first offset compensating circuit coupled to said first differential amplifier for storing an input offset voltage of said first differential amplifier when said first switching means is disabled and compensating said input offset voltage of said first differential amplifier to derive a first offset-free signal when said first switching means is enabled, a second offset compensating circuit coupled to said second differential amplifier for storing an input offset voltage of said second differential amplifier when said second switching means is disabled and compensating said input offset voltage of said second differential amplifier to derive a second offset-free signal when said second switching means is enabled, a first latch circuit for operatively storing said first offset-free signal when said first switching means is enabled, a second latch means for operatively storing said second offset-free signal when said second switching means is enabled, and a multiplex circuit for alternately outputting the outputs of said first and second latch circuits in synchronism with the enabled states of said first and second switching means, respectively.

13. The circuit according to claim 12, in which each of said first and second offset compensating circuits includes a pair of capacitors.

14. The circuit according to claim 12, in which each of said first and second latch circuits latch a plurality of times during each enabled period of said first and second switching means.

* * * * *